(12) United States Patent
Cho et al.

(10) Patent No.: US 11,838,028 B2
(45) Date of Patent: Dec. 5, 2023

(54) BAND-PASS ANALOG-TO-DIGITAL CONVERTER USING BIDIRECTIONAL VOLTAGE-CONTROLLED OSCILLATOR

(71) Applicant: KOREA ADVANCED INSTITUTE OF SCIENCE AND TECHNOLOGY, Daejeon (KR)

(72) Inventors: SeongHwan Cho, Daejeon (KR); Junseok Hong, Daejeon (KR); Pangi Park, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 5 days.

(21) Appl. No.: 17/687,110

(22) Filed: Mar. 4, 2022

(65) Prior Publication Data

US 2022/0376697 A1 Nov. 24, 2022

(30) Foreign Application Priority Data

May 20, 2021 (KR) .......................... 10-2021-0065057

(51) Int. Cl.
*H03M 1/00* (2006.01)
*H03M 1/12* (2006.01)

(52) U.S. Cl.
CPC ....... *H03M 1/1215* (2013.01); *H03M 1/1245* (2013.01)

(58) Field of Classification Search
CPC ........................... H03M 1/1215; H03M 1/1245
USPC .......................................... 341/155, 159, 120
See application file for complete search history.

(56) References Cited

U.S. PATENT DOCUMENTS

| 6,476,748 | B1 | 11/2002 | Calton | |
|---|---|---|---|---|
| 7,332,973 | B2* | 2/2008 | Lee | .......................... H03L 7/085 331/25 |
| 9,735,794 | B1* | 8/2017 | Paul | ...................... H03M 1/002 |
| 2010/0085226 | A1* | 4/2010 | Dyer | .................... H04L 25/0278 341/118 |
| 2013/0094259 | A1* | 4/2013 | Kurokawa | .............. H02M 7/44 363/95 |
| 2020/0295765 | A1* | 9/2020 | Agrawal | ................. H03L 7/083 |

FOREIGN PATENT DOCUMENTS

| JP | 2005-117442 | 4/2005 |
|---|---|---|
| JP | 3974497 | 6/2007 |
| JP | 6722900 | 6/2020 |
| JP | 2020-115634 | 7/2020 |
| KR | 10-0712488 | 4/2007 |
| KR | 10-2009-0043636 | 5/2009 |

* cited by examiner

Primary Examiner — Peguy Jean Pierre

(57) ABSTRACT

The present disclosure discloses a band-pass analog-to-digital converter (ADC) using a bidirectional voltage-controlled oscillator (VCO) including a first converter configured to receive an analog input signal and quantize the analog input signal according to a first clock signal to output a first digital signal, a second converter configured to receive the analog input signal and quantize the analog input signal in a time-interleaving manner according to a second clock signal, which has a phase opposite to that of the first clock signal, to output a second digital signal, and a multiplexer configured to receive the first and second digital signals and select one of the two signals in response to the first clock signal to finally output a digital output signal.

18 Claims, 8 Drawing Sheets

(a)          (b)

CLK change

BAND-PASS ANALOG-TO-DIGITAL CONVERTER USING BIDIRECTIONAL VOLTAGE-CONTROLLED OSCILLATOR

CROSS-REFERENCE TO RELATED APPLICATION

This application claims priority of Korean Patent Application No. 10-2021-0065057, filed on May 20, 2021, in the KIPO (Korean Intellectual Property Office), the disclosure of which is incorporated herein entirely by reference.

BACKGROUND OF THE INVENTION

Field of the Invention

The present disclosure relates to an analog-to-digital converter (ADC), and more particularly, to a band-pass ADC using a bidirectional voltage-controlled oscillator (VCO) suitable for sampling high-frequency signals by inverting a phase in an operation of a conventional VCO-based ADC.

Description of the Related Art

In general, there are various types of analog-to-digital converters (ADC) that convert an output value of an analog circuit into a digital value that is used in a digital circuit.

That is, a flash ADC, a pipeline ADC, and an over-sampling ADC using delta-sigma conversion are used in appropriate application fields according to their respective characteristics.

Recently, as a power supply voltage becomes lower, the design of an operational amplifier is becoming more difficult, and thus research on an ADC that does not use an operational amplifier is being conducted.

The ADC that does not use an operational amplifier includes a voltage-controlled oscillator (VCO)-based ADC.

However, recently, since complementary metal-oxide-semiconductor (CMOS) technology is advanced to a nanometer level, due to a supply voltage being lowered and PVT (Process, Voltage, and Temperature) variations, it is more difficult to design a high-performance ADC.

Due to such environmental factors, research on a time-based ADC using a VCO is being conducted.

Unlike a conventional ADC that processes voltage information using an operational amplifier or a comparator, the ADC using a VCO processes phase information using flip-flops and logic gates suitable for a low supply voltage in a fine CMOS process scale.

The ADC using a VCO may operate at a low voltage using a digital circuit and thus has an advantage of reducing power consumption.

Further, an important block in the ADC using a VCO is the VCO, and linearity, a tuning range (a difference between maximum and minimum values of output frequencies of the VCO), and the number of phases (the number of phases that may be detected) of the VCO determine a resolution and sampling rate of the ADC.

However, despite the importance of the VCO, research on a design of the VCO for the ADC has not received great attention.

Conventionally, an inverter is used as a time delay cell of a VCO in the form of a ring oscillator, and in order to use an oscillation signal in a section in which linearity is maintained, an input swing range is consequently limited to a specific level.

The limit of the input swing range and the number of insufficient phases is problematic in that the performance of ADC is deteriorated.

Typically, an ADC is used at a receiver stage for radio frequency (RF) communication, and according to a recent trend of a carrier frequency becoming faster, a direct sampling structure is receiving a lot of attention.

Accordingly, research on a Nyquist sampling ADC or band-pass ADC structure has been actively conducted.

Further, as a CMOS manufacturing process becomes finer, a VCO-based ADC, which is the most scalable structure having few analog components except for a VCO in an analog-digital converter structure, has attracted great attention.

FIG. 1 is a block diagram of a conventional ADC using a VCO.

FIG. 2 is a graph illustrating amplitudes of intrinsic first-order noise-shaping with respect to a change in frequency at an output stage of the conventional ADC using a VCO illustrated in FIG. 1.

Operation of the conventional ADC using a VCO will be schematically described as follows with reference to FIGS. 1 and 2.

The VCO-based ADC includes a ring VCO 10, a reset counter 20, a switch 30, and a filter 40.

The reset counter 20 includes a plurality of counters 21 configured to receive a plurality of oscillation signals from the ring VCO 10, a first adder 22 configured to sum a plurality of counting signals output from the plurality of counters 21, a delayer 23 including first and second flip-flops configured to delay an output of the first adder 22 in response to a clock signal, and a second adder 24 configured to subtract an output signal of the first flip-flop from an output signal of the second flip-flop.

In the case of a VCO-based ADC structure, since the VCO-based ADC is a time-based converter, a sampling frequency may be reduced when time-interleaving is performed, thereby improving resolution.

However, as shown in FIG. 2, since such an intrinsic characteristic of first-order noise-shaping is advantageous for sampling low-frequency signals, it was difficult to produce a VCO-based ADC for sampling band-pass signals.

That is, in the conventional VCO-based ADC structure, at least four channels must be time-interleaved in order to produce a band-pass ADC.

This requires much more power in terms of power consumption and requires many more measures to eliminate interleaving spurs caused by a mismatch between interleaving channels and gain errors.

Further, the conventional VCO-based ADC has a structure that counts the number of edges using a counter when a VCO generates a voltage swing with a frequency proportional to a voltage after receiving an input signal in the form of the voltage.

Since this method has a form in which a residual phase remaining in a previous sample is subtracted from a current residual phase, a q-noise transfer function in the form of $1-z^{-1}$ is generated, and thus, q-noise is first modulated.

Accordingly, the conventional VCO-based ADC has a limitation in that it is not suitable for sampling high-frequency signals.

SUMMARY OF THE INVENTION

The present disclosure is directed to providing a band-pass analog-to-digital converter (ADC) using a bidirectional voltage-controlled oscillator (VCO) suitable for sampling high-frequency signals by implementing a VCO structure in the ADC in a bidirectional time-interleaving manner and directly performing a radio frequency (RF) or intermediate frequency conversion without performing down-conversion using a mixer.

According to an aspect of the present disclosure, there is provided a band-pass ADC using a bidirectional VCO including a first converter configured to receive an analog input signal and quantize the analog input signal according to a first clock signal to output a first digital signal, a second converter configured to receive the analog input signal and quantize the analog input signal in a time-interleaving manner according to a second clock signal, which has a phase opposite to that of the first clock signal, to output a second digital signal, and a multiplexer configured to receive the first and second digital signals and select one of the two signals in response to the first clock signal to finally output a digital output signal.

The first converter may include a first sampling/holding part configured to sample a voltage level of the analog input signal at a rising edge of the first clock signal and hold the voltage level of the analog input signal until a next rising edge of the first clock signal to output a first sampling signal, a first VCO configured to output a first oscillation signal having a frequency proportional to a voltage level of the first sampling signal in response to a third clock signal and a fourth clock signal each having a frequency of half of a frequency of the first clock signal, and a first counter configured to count the number of pulse signals in the first oscillation signal to output the first digital signal.

The first VCO may include a first time delayer configured to delay a time of the first sampling signal by operating a plurality of inverters connected in a forward direction or a plurality of inverters connected in a reverse direction according to a clock signal applied by receiving the first sampling signal, and a first oscillation frequency controller connected to the first time delayer and configured to control a frequency of the first oscillation signal using a frequency of the first sampling signal to output a voltage swing.

The first time delayer may include a first delayer configured to delay the time of the first sampling signal by supplying a power supply voltage to the plurality of inverters, which are built-in and connected in the forward direction, and simultaneously operating the plurality of inverters when the third clock signal is applied, and a second delayer configured to delay the time of the first sampling signal by supplying the power supply voltage to the plurality of inverters, which are built-in and connected in the reverse direction, and simultaneously operating the plurality of inverters when the fourth clock signal having a phase opposite to that of the third clock signal is applied.

At a time point at which the applied clock signal is changed from the third clock signal to the fourth clock signal, a voltage of the first oscillation signal at a corresponding node may be held, and a phase of the first oscillation signal may be changed and proceed in a direction opposite to a direction in which the phase initially proceeds.

The first counter may count rising edges of the pulse signals in the first oscillation signal.

The second converter may include a second sampling/holding part configured to sample a voltage level of the analog input signal at a rising edge of the second clock signal and hold the voltage level of the analog input signal until a next rising edge of the second clock signal to output a second sampling signal, a second VCO configured to output a second oscillation signal having a frequency proportional to a voltage level of the second sampling signal in response to a third clock signal and a fourth clock signal each having a frequency of half of a frequency of the second clock signal, and a second counter configured to count the number of pulse signals in the second oscillation signal to output the second digital signal.

The second VCO may include a second time delayer configured to delay a time of the second sampling signal by operating a plurality of inverters connected in a forward direction or a plurality of inverters connected in a reverse direction according to a clock signal applied by receiving the second sampling signal, and a second oscillation frequency controller connected to the second time delayer and configured to control a frequency of the second oscillation signal using a frequency of the second sampling signal to output a voltage swing.

The second time delayer may include a first delayer configured to delay the time of the second sampling signal by supplying a power supply voltage to the plurality of inverters, which are built-in and connected in the forward direction, and simultaneously operating the plurality of inverters when the third clock signal is applied, and a second delayer configured to delay the time of the second sampling signal by supplying the power supply voltage to the plurality of inverters, which are built-in and connected in the reverse direction, and simultaneously operating the plurality of inverters when the fourth clock signal having a phase opposite to that of the third clock signal is applied.

At a time point at which the applied clock signal is changed from the third clock signal to the fourth clock signal, a voltage of the second oscillation signal at a corresponding node may be held, and a phase of the second oscillation signal may be changed and proceed in a direction opposite to a direction in which the phase initially proceeds.

The second counter may count rising edges of the pulse signals in the second oscillation signal.

Specific matters of other embodiments are included in "detailed description of exemplary embodiments" and the accompanying "drawings."

Advantages and/or features of the present disclosure and methods of accomplishing the same will be apparent by referring to various embodiments described below in detail in connection with the accompanying drawings.

However, the present disclosure is not limited to the configuration of each of the embodiments disclosed below, but may also be implemented in various other forms. Each of the embodiments disclosed herein makes the disclosure of the present disclosure complete and are provided to completely inform those skilled in the art to which the present disclosure pertains of the scope of the disclosure. The present disclosure is defined only by the scope of the claims.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
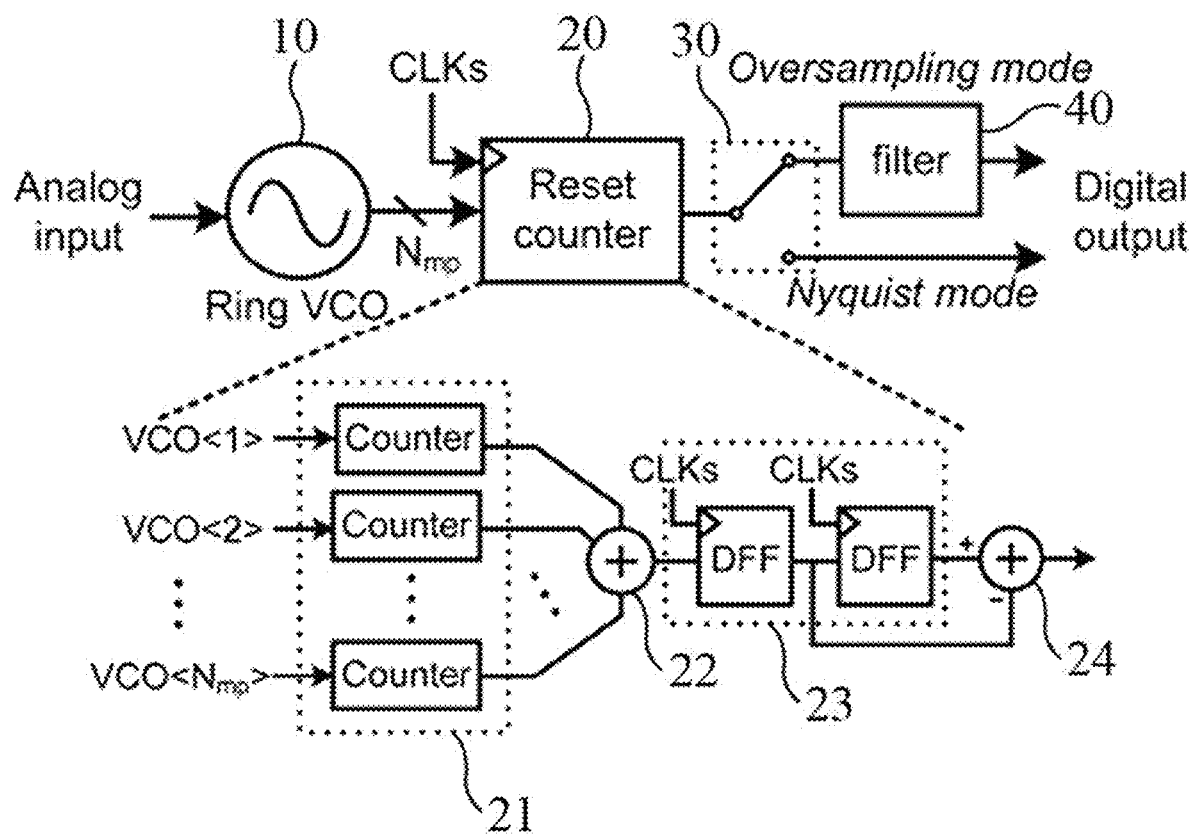
FIG. 1 is a block diagram of a conventional analog-to-digital converter (ADC) using a voltage-controlled oscillator (VCO)
Figure 2:
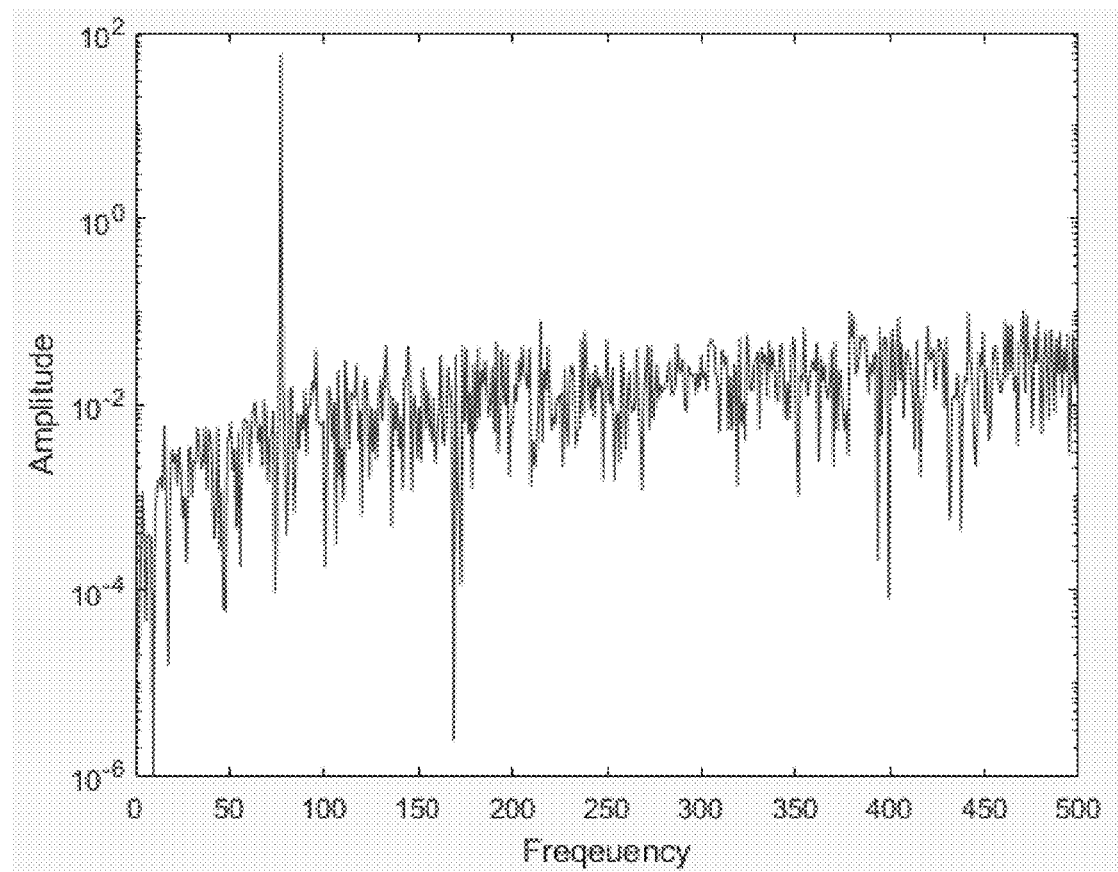
FIG. 2 is a graph illustrating amplitudes of intrinsic first-order noise-shaping with respect to a change in frequency at an output stage of the conventional ADC using a VCO illustrated in FIG. 1.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

Figure 3:
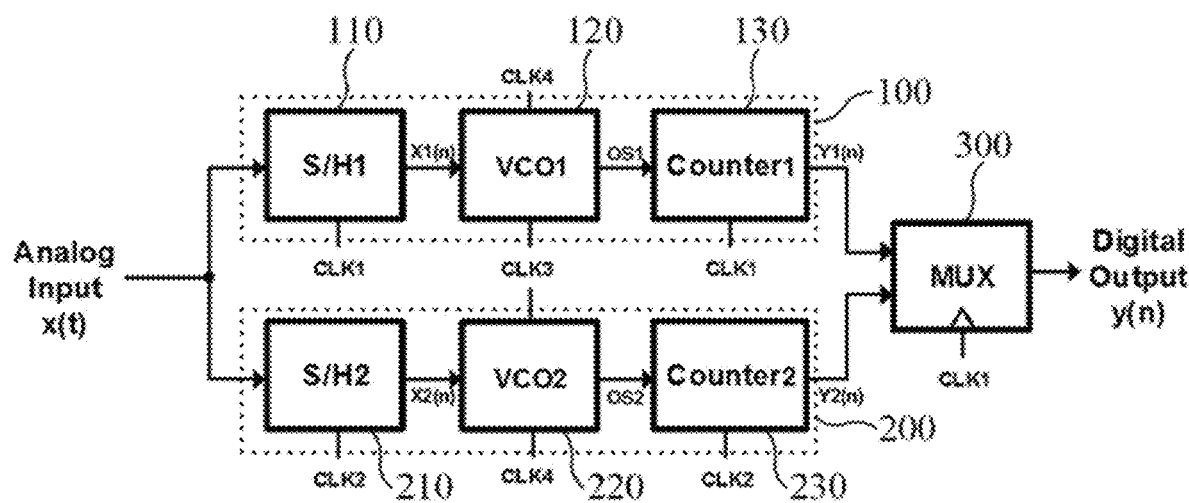
FIG. 3 is a schematic block diagram of a band-pass ADC using a bidirectional VCO according to the present disclosure.

FIG. 3 is a schematic block diagram of a band-pass analog-to-digital converter (ADC) using a bidirectional voltage-controlled oscillator (VCO) according to the present disclosure, and the ADC includes a first converter 100, a second converter 200, and a multiplexer 300.

The first converter 100 includes a first sampling/holding part 110, a first VCO 120, and a first counter 130, and the second converter 200 includes a second sampling/holding part 210, a second VCO 220, and a second counter 230.

Figure 4:
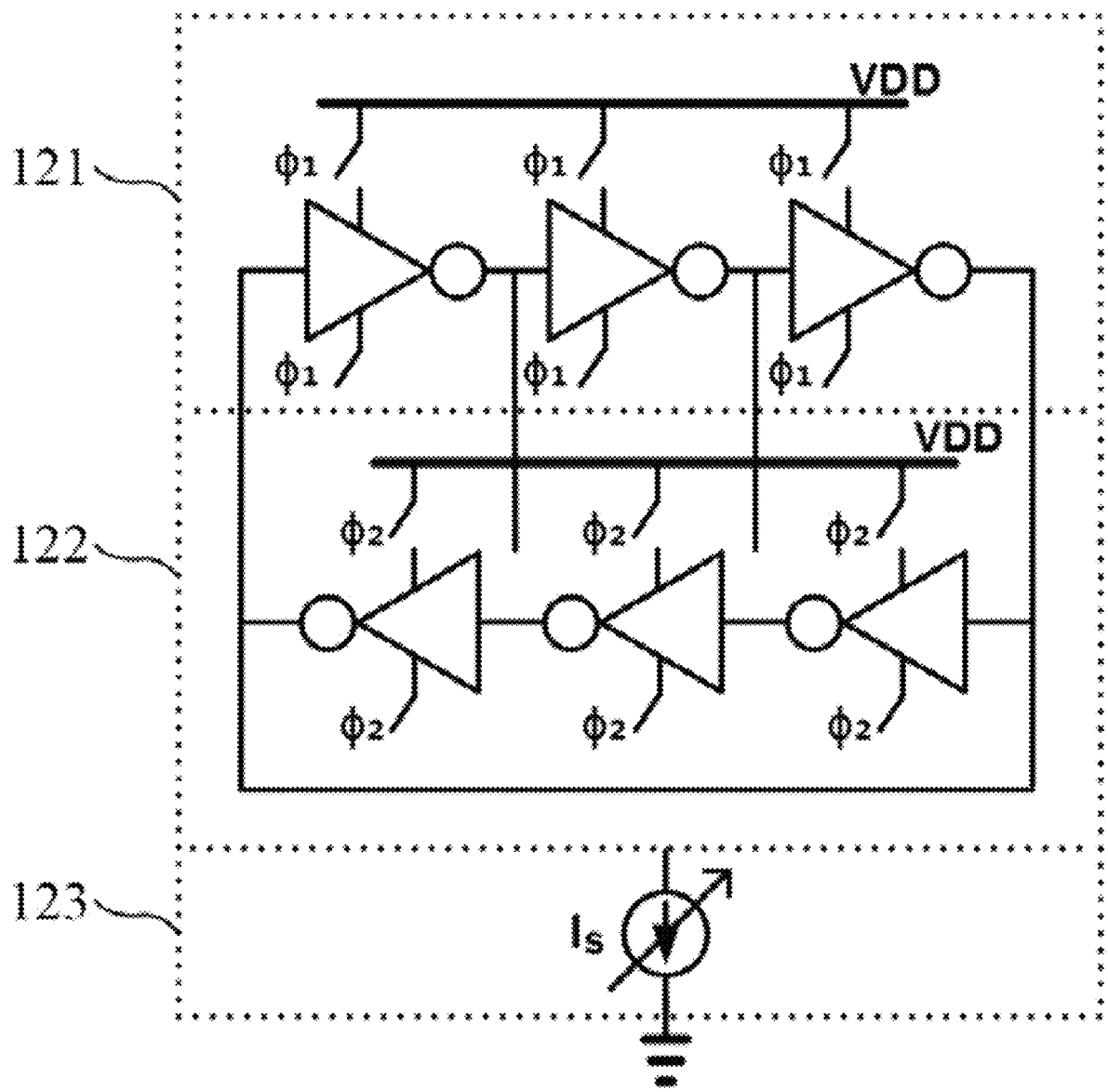
FIG. 4 is an internal circuit diagram of a first VCO (120) in the ADC illustrated in FIG. 3.
Figure 4:
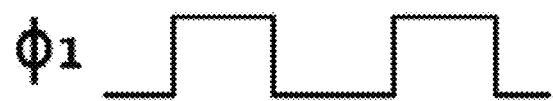
Figure 4:

FIG. 4 is an internal circuit diagram of the first VCO 120 in the ADC illustrated in FIG. 3, and the first VCO 120 includes a first time delayer including a first delayer 121 and a second delayer 122, and a first oscillation frequency controller 123.

The first delayer 121 includes a plurality of inverters connected in a forward direction from an input stage to an output stage, and the second delayer 122 includes a plurality of inverters connected in a reverse direction from an output stage to an input stage, and the first oscillation frequency controller 123 includes a variable current source $I_s$.

Figure 5:
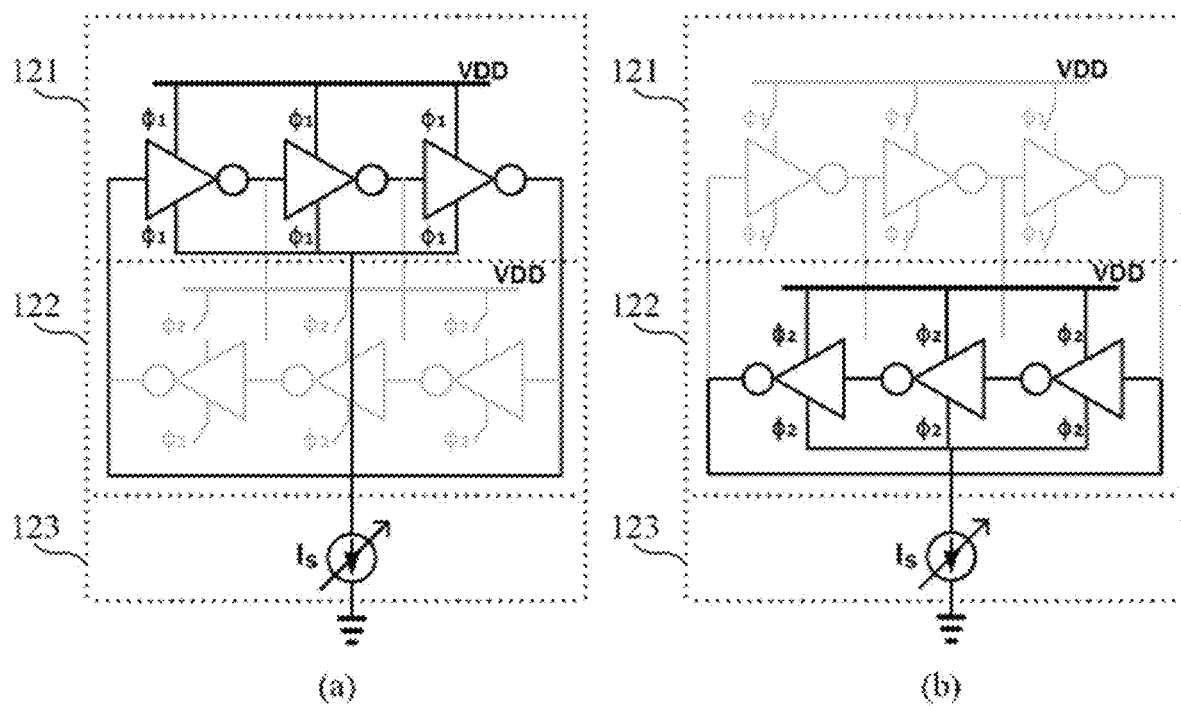
FIG. 5 is an internal circuit diagram illustrating an operation that is activated according to a clock signal applied to the first VCO (120) illustrated in FIG. 3.

FIG. 5 is an internal circuit diagram illustrating an operation that is activated according to a clock signal applied to the first VCO 120 illustrated in FIG. 3, and illustrates a case (FIG. 5A) in which the applied clock signal is a first pulse $\phi_1$ and a case (FIG. 5B) in which the applied clock signal is a second pulse $\phi_2$.

Figure 6:
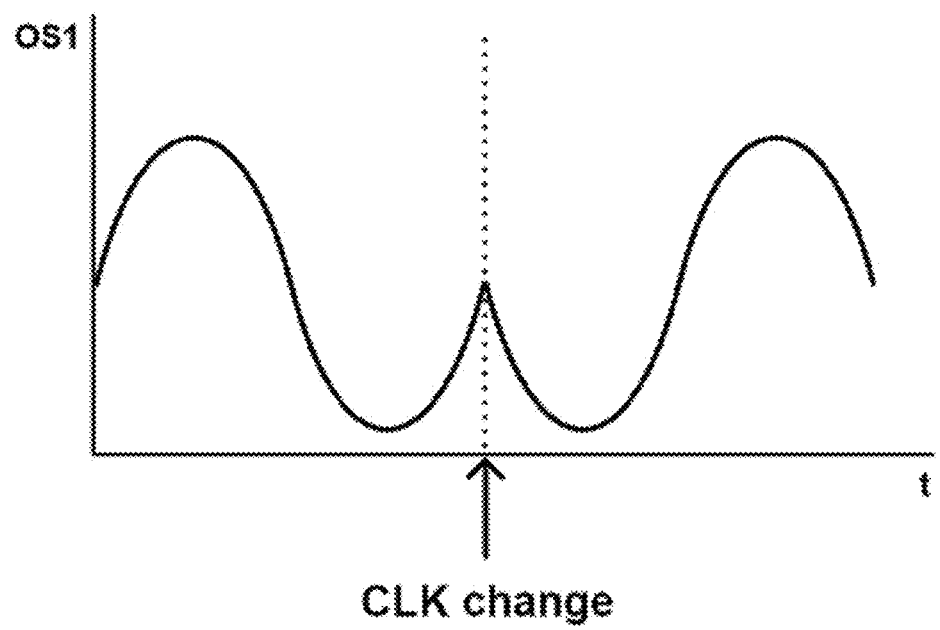
FIG. 6 is a graph illustrating a phase of a first oscillation signal (OS1), which is inverted at a time point when the clock signal is changed and proceeds, when the circuit illustrated in FIG. 3 is driven.

FIG. 6 is a graph illustrating a phase of a first oscillation signal OS1, which is inverted at a time point when the clock signal is changed and proceeds when the circuit illustrated in FIG. 3 is driven.

Since a configuration and a function of each component of the second VCO 220 are the same as those of the first VCO 120, in FIGS. 4 to 6, only the configuration and the function of each component of the first VCO 120 are described, and the contents thereof are applied to the second VCO 220.

Figure 7:
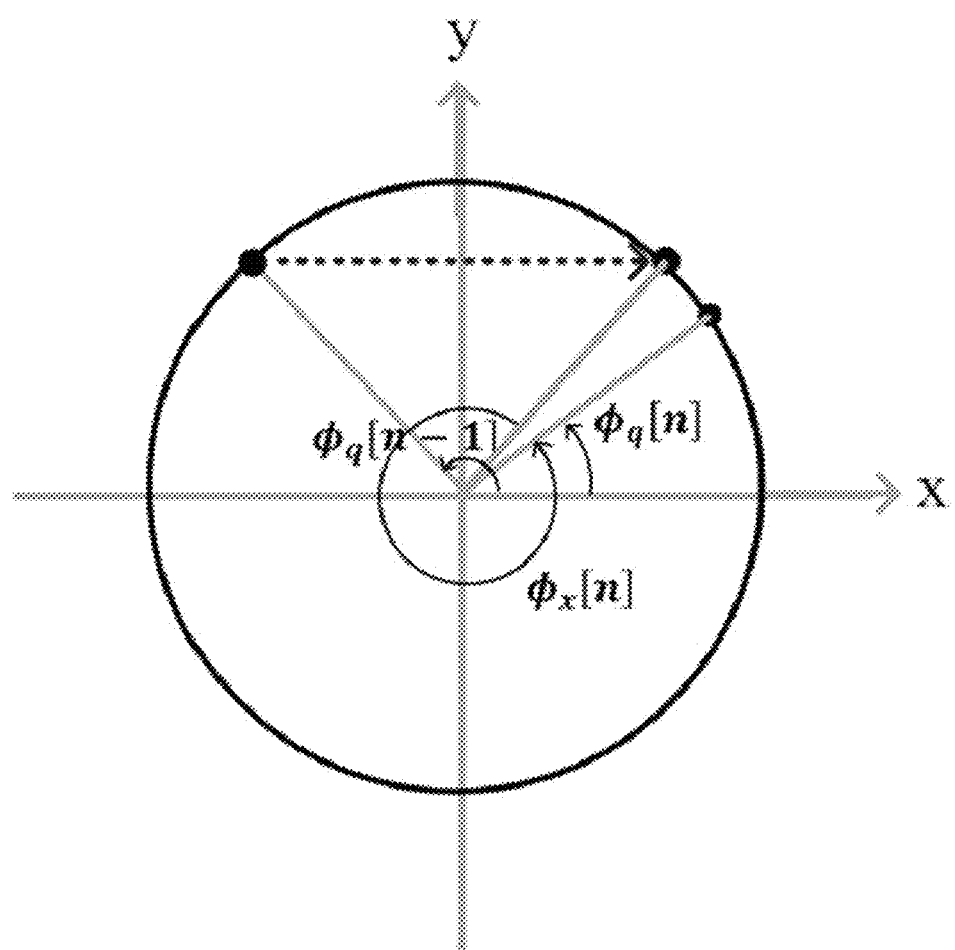
FIG. 7 is a two-dimensional graph illustrating relative phase changes in an output signal of the VCO when the circuit illustrated in FIG. 4 is driven.

FIG. 7 is a two-dimensional graph illustrating relative phase changes in an output signal of the VCO when the circuit illustrated in FIG. 4 is driven.

Figure 8:
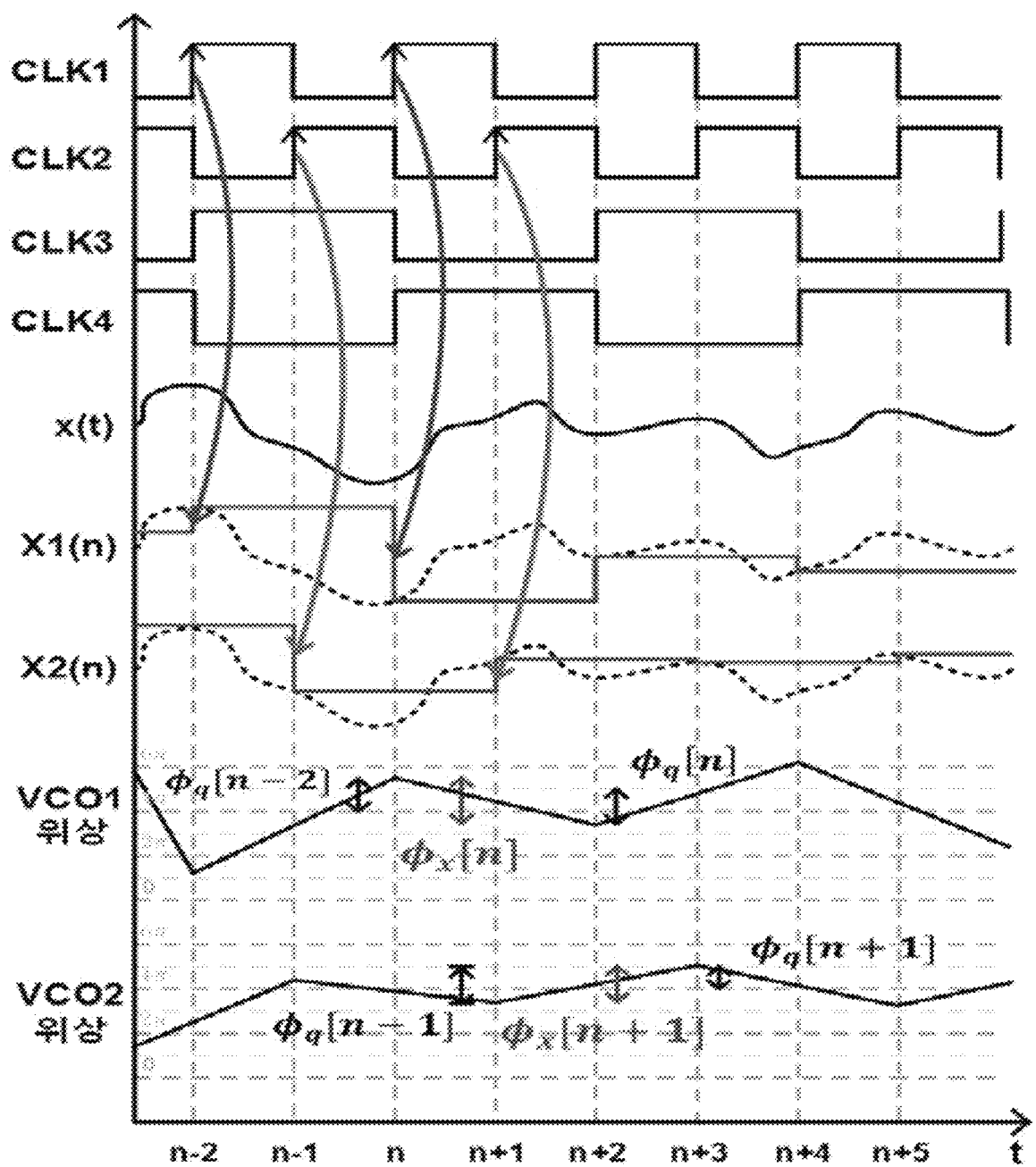
FIG. 8 is a set of timing diagrams illustrating waveforms and phases of an output signal at each node according to a change in clock signal when the circuit illustrated in FIG. 3 is driven.

FIG. 8 is a set of timing diagrams illustrating waveforms and phases of an output signal at each node according to a change in clock signal when the circuit illustrated in FIG. 3 is driven.

A structure and function of each component of the band-pass ADC using a bidirectional VCO according to the present disclosure will be described below with reference to FIGS. 3 and 8.

In FIGS. 3 and 8, X1[n] and X2[n] refer to signals generated by an analog input signal x(t) respectively passing through the first and second sampling/holding parts 110 and 210, OS1 and OS2 respectively represent output signals of the first and second VCOs 120 and 220, and Y1[n] and Y2[n] respectively represent output signals of the first and second counters 130 and 230.

As shown in FIG. 8, a first clock signal CLK1 and a second clock signal CLK2 have opposite phases while each having a frequency of half of a sampling frequency, and a third clock signal CLK3 and a fourth clock signal CLK4 have opposite phases while each having a frequency of half of each of the first clock signal CLK1 and the second clock signal CLK2.

A sampling signal is represented by a square wave having a voltage level similar to that of a waveform of the analog input signal.

The first converter 100 receives the analog input signal x(t) and quantizes the analog input signal x(t) according to the first clock signal CLK1 to output a first digital signal Y1[n].

The second converter 200 receives the analog input signal x(t) and quantizes the analog input signal x(t) in a time-interleaving manner according to the second clock signal CLK2 to output a second digital signal Y2[n].

That is, when the analog input signal x(t) is input, the first and second sampling/holding parts 110 and 210 hold a voltage level value of the analog input signal x(t) at rising edges of the first and second clock signals CLK1 and CLK2 until next rising edges thereof to output first and second sampling signals X1(n) and X2(n), respectively.

The first and second VCOs 120 and 220 receive the first and second sampling signals X1(n) and X2(n) and provide the first and second oscillation signals OS1 and OS2, each of which has a frequency proportional to the voltage level of the sampling signal, to the first and second counters 130 and 230, respectively.

The first and second counters 130 and 230 count the number of rising edges present in the first and second oscillation signals OS1 and OS2 for one period of the sampling clock signal to provide the first and second digital signals Y1[n] and Y2[n], respectively.

The multiplexer 300 receives the first and second digital signals Y1[n] and Y2[n] from the first and second counters 130 and 230 and selects one of the two signals in response to the first clock signal CLK1 to finally output a digital output signal y[n].

Figure 9:
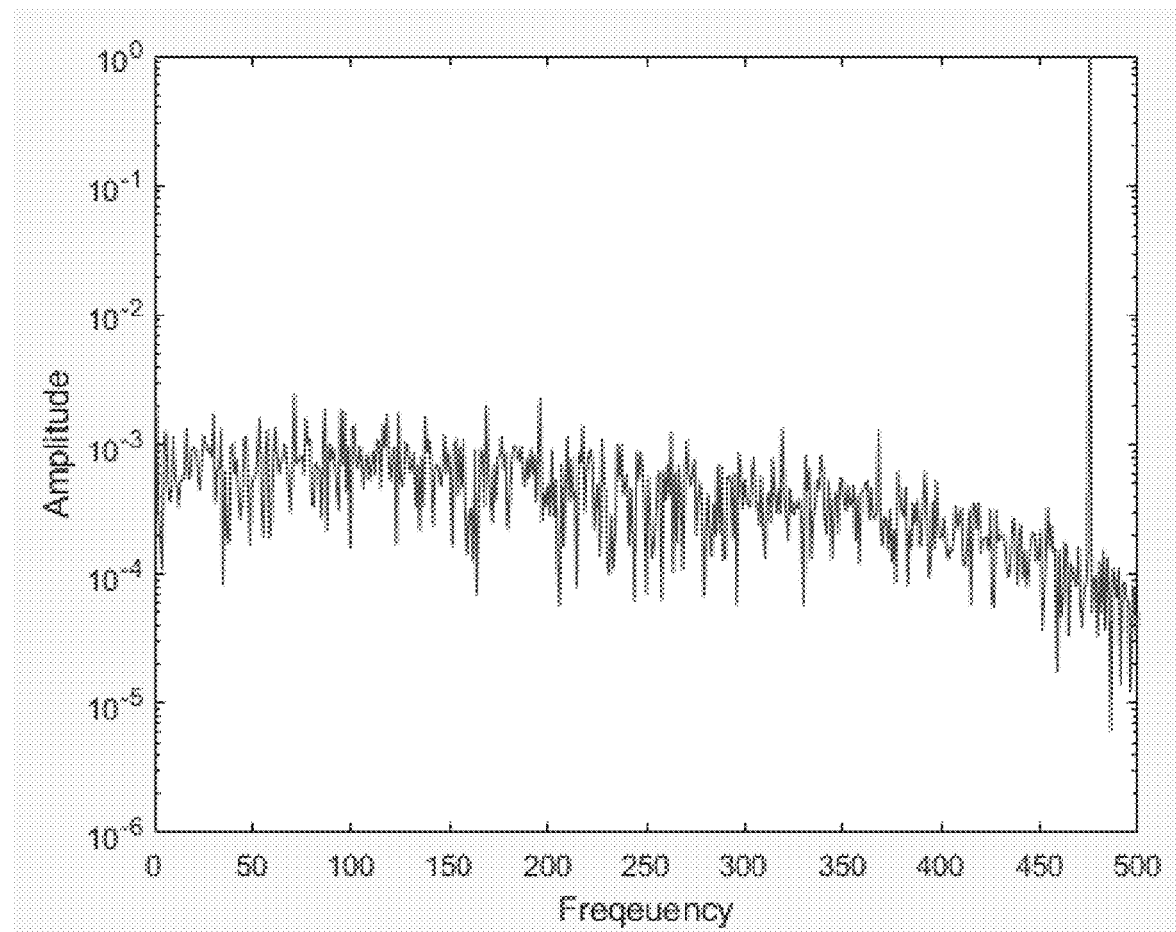
FIG. 9 is a waveform diagram illustrating an experimental result of a q-noise signal output with respect to a change in operating frequency of a first converter (100) or a second converter (200) when the circuit illustrated in FIG. 3 is driven.

FIG. 9 is a waveform diagram illustrating an experimental result of a q-noise signal output with respect to a change in operating frequency of the first converter 100 or the second converter 200 when the circuit illustrated in FIG. 3 is driven.

Figure 10:
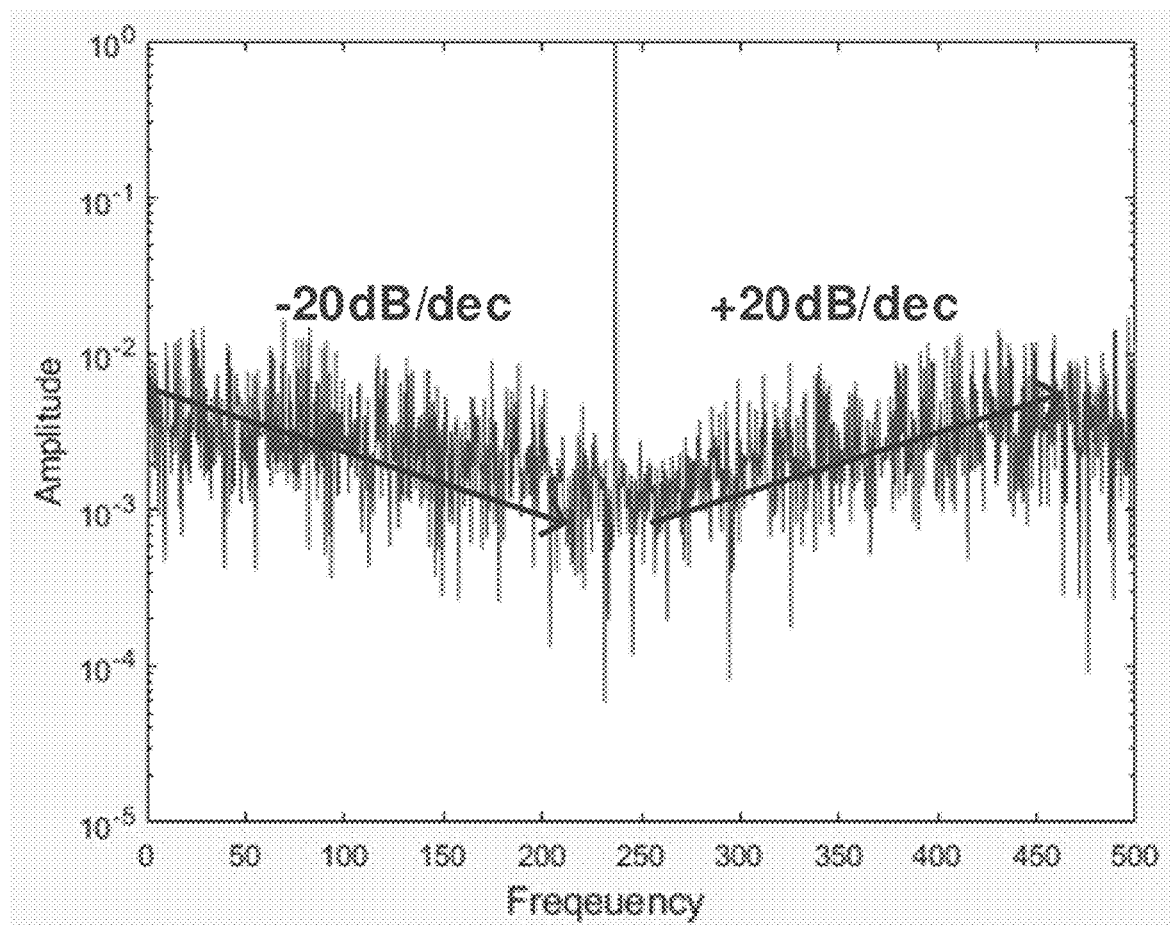
FIG. 10 is a waveform diagram illustrating an experimental result of a q-noise signal and an effective signal output with respect to a change in operating frequency when the circuit illustrated in FIG. 3 is driven.

FIG. 10 is a waveform diagram illustrating an experimental result of a q-noise signal and an effective signal output with respect to a change in operating frequency when the circuit illustrated in FIG. 3 is driven.

Operations of the band-pass ADC using a bidirectional VCO according to an embodiment of the present disclosure will be described in detail with reference to FIGS. 3 to 10.

The first sampling/holding part 110 samples a voltage level of the analog input signal x(t) at a rising edge of the first clock signal CLK1 and holds a value of the voltage level until a next rising edge to output the first sampling signal X1[n].

The first VCO 120 outputs the first oscillation signal OS1 having a frequency proportional to the voltage level of the first sampling signal X1[n] in response to the third clock signal CLK3 and the fourth clock signal CLK4.

That is, as shown in FIG. 5A, when the first pulse 1, that is, the third clock signal CLK3, is applied to the first VCO 120, a power supply voltage is supplied to the first delayer 121 of the first time delayer, and the first oscillation frequency controller 123 is connected to the first delayer 121 so that the plurality of inverters connected in the forward direction operate simultaneously.

Accordingly, the first oscillation signal OS1 is output as a voltage swing regulated at a frequency of the first sampling signal X1[n], which is an input signal.

On the other hand, as shown in FIG. 5B, when the second pulse $\phi_2$ having a phase opposite to that of the third clock signal CLK3 is applied to the first VCO 120, that is, the fourth clock signal CLK4 is applied to the first VCO 120, the power supply voltage is supplied to the second delayer 122 of the first time delayer, and the first oscillation frequency controller 123 is connected to the second delayer 122 so that the plurality of inverters connected in the reverse direction operate simultaneously.

Accordingly, as shown in FIG. 6, at a time point at which the applied clock signal is changed from the third clock signal CLK3 to the fourth clock signal CLK4, a voltage of the first oscillation signal OS1 at the corresponding node is held, and a phase of the first oscillation signal OS1 is changed and proceeds in a direction opposite to a direction in which the phase initially proceeds.

Thus, a starting point of a next phase becomes a time point obtained by subtracting a residual phase remaining after the current sampling is performed from $2\pi$.

In FIG. 7, $\phi_x[n]$ represents a phase proceeding during a current clock signal, $\phi_{q[n]}$ represents a residual phase after current sampling is performed, and $\phi_q[n-1]$ represents a residual phase remaining after previous sampling is performed.

Further, proceeding in a direction opposite to a direction in which the phase originally proceeds may be viewed as a process proceeding in an initial direction as the phase proceeds to points symmetrical about a y-axis.

At this point, since edges must be counted with respect to $2\pi$, that is, a positive x-axis, the first and second counters 130 and 230 must count rising edges after the direction of the phase is changed.

Accordingly, under the condition of $0<\phi_q[n-1]<\pi$, the counted digital output y[n] is expressed as Equation 1, $$y[n] = \frac{1}{2\pi}(\phi_x[n] + (2\pi - \phi_q[n]) - \phi_q[n-1]) \quad \text{[Equation 1]}$$

When the digital output y[n] calculated in Equation 1 is z-transformed, the digital output y[n] is expressed as Equation 2.

$$Y(z) = \frac{1}{2\pi}(\Phi_x(z) - (1+z^{-1})\Phi_q(z)) \quad \text{[Equation 2]}$$

In FIG. 3, the first counter 130 counts the number of pulse signals in the first oscillation signal OS1 to output the first digital signal Y1[n].

Meanwhile, the second sampling/holding part 210 samples a voltage level of the analog input signal x(t) at a rising edge of the second clock signal CLK2 having a phase opposite to that of the first clock signal CLK1 and holds a value of the voltage level until a next rising edge to output the second sampling signal X2[n].

The second VCO 220 outputs the second oscillation signal OS2 having a frequency proportional to the voltage level of the second sampling signal X2[n].

The second counter 230 counts the number of pulse signals in the second oscillation signal OS2 to output the second digital signal Y2[n].

The multiplexer 300 selects one of the first digital signal Y1[n] and the second digital signal Y2[n] in response to the first clock signal CLK1 to finally output the digital output y[n].

A phase in each of the first VCO 120 and the second VCO 220 is proportional to the number of pulses in the oscillation signal in the corresponding period, as shown in FIG. 8.

Accordingly, since the bidirectional VCO structure of the present disclosure is a structure in which time-interleaving is performed in both directions in the same VCO as compared with a unidirectional VCO structure, quantization noise is reduced.

Further, as shown in FIG. 9, since q-noise according to the change in operating frequency is low pass filtered, a noise transfer function that may not be generated with a conventional VCO-based ADC structure, in which quantization noise is high-pass filtered, may be generated.

Further, as shown in FIG. 10, instead of band-rejecting the q-noise according to the change in operating frequency, an effective signal is band-pass filtered. This is in contrast to the structure of the conventional VCO-based ADC, which requires time-interleaving on at least four channels to produce a band-pass ADC.

Thus, according to the present disclosure, power consumption may be reduced, and interleaving spurs caused by a mismatch between interleaving channels or gain errors may be prevented in advance.

Further, unlike a conventional method of digital-converting an analog input signal after down-converting the analog input signal using a mixer, it is possible to directly perform a radio frequency (RF) or intermediate frequency conversion, thereby sufficiently utilizing the advantages of digital signal processing which is relatively much easier than analog signal processing.

As such, the present disclosure provides a band-pass ADC using a bidirectional VCO suitable for sampling high-frequency signals by implementing a VCO structure in the ADC in a bidirectional time-interleaving manner and directly performing an RF or intermediate frequency conversion without performing down-conversion using a mixer.

Accordingly, the number of VCOs required for band-pass noise shaping is reduced to half so that power efficiency may be improved several times as compared with a conventional VCO-based ADC.

Further, as compared with a conventional VCO-based ADC, the number of channels is reduced to half so that influence due to interleaving spurs caused by a mismatch between interleaving channels or gain errors may be minimized.

Further, unlike a conventional VCO-based ADC using a mixer, it is possible to sufficiently utilize the advantages of digital signal processing in which signal processing is relatively easy.

According to the present disclosure, by employing a structure in which time-interleaving is performed in both directions in the same VCO, the number of VCOs required for band-pass noise shaping is reduced to half so that power efficiency can be improved several times as compared with a conventional VCO-based ADC.

Further, as compared with a conventional VCO-based ADC, the number of channels can be reduced to half so that influence due to interleaving spurs caused by a mismatch between interleaving channels or gain errors can be minimized.

Further, unlike a conventional VCO-based ADC using a mixer, it is possible to directly perform an RF or intermediate frequency conversion, thereby sufficiently utilizing the advantages of digital signal processing which is relatively much easier than analog signal processing.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A band-pass analog-to-digital converter (ADC) using a bidirectional voltage-controlled oscillator (VCO), the ADC comprising:
   a first converter configured to receive an analog input signal and quantize the analog input signal according to a first clock signal to output a first digital signal;
   a second converter configured to receive the analog input signal and quantize the analog input signal in a time-interleaving manner according to a second clock signal, which has a phase opposite to that of the first clock signal, to output a second digital signal; and
   a multiplexer configured to receive the first and second digital signals and select one of the two signals in response to the first clock signal to finally output a digital output signal,
   wherein the first converter comprising:
      a first sampling/holding part configured to sample a voltage level of the analog input signal at a rising edge of the first clock signal and hold the voltage level of the analog input signal until a next rising edge of the first clock signal to output a first sampling signal;
      a first VCO configured to output a first oscillation signal having a frequency proportional to a voltage level of the first sampling signal in response to a third clock signal and a fourth clock signal each having a frequency of half of a frequency of the first clock signal; and
      a first counter configured to count the number of pulse signals in the first oscillation signal to output the first digital signal.

2. The ADC of claim 1, wherein the first VCO comprising:
   a first time delayer configured to delay a time of the first sampling signal by operating a plurality of inverters connected in a forward direction or a plurality of inverters connected in a reverse direction according to a clock signal applied by receiving the first sampling signal; and
   a first oscillation frequency controller connected to the first time delayer and configured to control a frequency of the first oscillation signal using a frequency of the first sampling signal to output a voltage swing.

3. The ADC of claim 2, wherein the first time delayer comprising:
  a first delayer configured to delay the time of the first sampling signal by supplying a power supply voltage to the plurality of inverters, which are built-in and connected in the forward direction, and simultaneously operating the plurality of inverters when the third clock signal is applied; and
  a second delayer configured to delay the time of the first sampling signal by supplying the power supply voltage to the plurality of inverters, which are built-in and connected in the reverse direction, and simultaneously operating the plurality of inverters when the fourth clock signal having a phase opposite to that of the third clock signal is applied.

4. The ADC of claim 3, wherein at a time point at which the applied clock signal is changed from the third clock signal to the fourth clock signal:
  a voltage of the first oscillation signal at a corresponding node is held; and
  a phase of the first oscillation signal is changed and proceeds in a direction opposite to a direction in which the phase initially proceeds.

5. The ADC of claim 1, wherein the first counter counts rising edges of the pulse signals in the first oscillation signal.

6. A band-pass analog-to-digital converter (ADC) using a bidirectional voltage-controlled oscillator (VCO), the ADC comprising:
  a first converter configured to receive an analog input signal and quantize the analog input signal according to a first clock signal to output a first digital signal;
  a second converter configured to receive the analog input signal and quantize the analog input signal in a time-interleaving manner according to a second clock signal, which has a phase opposite to that of the first clock signal, to output a second digital signal; and
  a multiplexer configured to receive the first and second digital signals and select one of the two signals in response to the first clock signal to finally output a digital output signal,
  wherein the second converter comprising:
    a second sampling/holding part configured to sample a voltage level of the analog input signal at a rising edge of the second clock signal and hold the voltage level of the analog input signal until a next rising edge of the second clock signal to output a second sampling signal;
    a second VCO configured to output a second oscillation signal having a frequency proportional to a voltage level of the second sampling signal in response to a third clock signal and a fourth clock signal each having a frequency of half of a frequency of the second clock signal; and
    a second counter configured to count the number of pulse signals in the second oscillation signal to output the second digital signal.

7. The ADC of claim 6, wherein the second VCO comprising:
  a second time delayer configured to delay a time of the second sampling signal by operating a plurality of inverters connected in a forward direction or a plurality of inverters connected in a reverse direction according to a clock signal applied by receiving the second sampling signal; and
  a second oscillation frequency controller connected to the second time delayer and configured to control a frequency of the second oscillation signal using a frequency of the second sampling signal to output a voltage swing.

8. The ADC of claim 7, wherein the second time delayer comprising:
  a first delayer configured to delay the time of the second sampling signal by supplying a power supply voltage to the plurality of inverters, which are built-in and connected in the forward direction, and simultaneously operating the plurality of inverters when the third clock signal is applied, and
  a second delayer configured to delay the time of the second sampling signal by supplying the power supply voltage to the plurality of inverters, which are built-in and connected in the reverse direction, and simultaneously operating the plurality of inverters when the fourth clock signal having a phase opposite to that of the third clock signal is applied.

9. The ADC of claim 8, wherein at a time point at which the applied clock signal is changed from the third clock signal to the fourth clock signal:
  a voltage of the second oscillation signal at a corresponding node is held; and
  a phase of the second oscillation signal is changed and proceeds in a direction opposite to a direction in which the phase initially proceeds.

10. The ADC of claim 6, wherein the second counter counts rising edges of the pulse signals in the second oscillation signal.

11. A band-pass analog-to-digital converter (ADC) using a bidirectional voltage-controlled oscillator (VCO), the ADC comprising:
  a first converter configured to quantize an analog input signal according to a first clock signal to output a first digital signal;
  a second converter configured quantize the analog input signal in a time-interleaving manner according to a second clock signal to output a second digital signal; and
  a multiplexer configured to receive the first and second digital signals and select one of the two signals in response to the first clock signal to finally output a digital output signal,
  wherein the first converter comprising:
    a first sampling/holding part configured to sample a voltage level of the analog input signal at a rising edge of the first clock signal and hold the voltage level of the analog input signal until a next rising edge of the first clock signal to output a first sampling signal;
    a first VCO configured to output a first oscillation signal having a frequency proportional to a voltage level of the first sampling signal in response to a third clock signal and a fourth clock signal each having a frequency of half of a frequency of the first clock signal; and
    a first counter configured to count the number of pulse signals in the first oscillation signal to output the first digital signal.

12. The ADC of claim 11, wherein the first VCO comprising:
  a first time delayer configured to delay a time of the first sampling signal by operating a plurality of inverters connected in a forward direction or a plurality of inverters connected in a reverse direction according to a clock signal applied by receiving the first sampling signal; and a first oscillation frequency controller connected to the first time delayer and configured to control a frequency of the first oscillation signal using a frequency of the first sampling signal to output a voltage swing.

13. The ADC of claim 12, wherein the first time delayer comprising:
   a first delayer configured to delay the time of the first sampling signal by supplying a power supply voltage to the plurality of inverters, which are built-in and connected in the forward direction, and simultaneously operating the plurality of inverters when the third clock signal is applied; and
   a second delayer configured to delay the time of the first sampling signal by supplying the power supply voltage to the plurality of inverters, which are built-in and connected in the reverse direction, and simultaneously operating the plurality of inverters when the fourth clock signal having a phase opposite to that of the third clock signal is applied.

14. The ADC of claim 13, wherein at a time point at which the applied clock signal is changed from the third clock signal to the fourth clock signal:
   a voltage of the first oscillation signal at a corresponding node is held; and
   a phase of the first oscillation signal is changed and proceeds in a direction opposite to a direction in which the phase initially proceeds.

15. A band-pass analog-to-digital converter (ADC) using a bidirectional voltage-controlled oscillator (VCO), the ADC comprising:
   a first converter configured to quantize an analog input signal according to a first clock signal to output a first digital signal;
   a second converter configured quantize the analog input signal in a time-interleaving manner according to a second clock signal to output a second digital signal; and
   a multiplexer configured to receive the first and second digital signals and select one of the two signals in response to the first clock signal to finally output a digital output signal,
   wherein the second converter comprising:
      a second sampling/holding part configured to sample a voltage level of the analog input signal at a rising edge of the second clock signal and hold the voltage level of the analog input signal until a next rising edge of the second clock signal to output a second sampling signal;
      a second VCO configured to output a second oscillation signal having a frequency proportional to a voltage level of the second sampling signal in response to a third clock signal and a fourth clock signal each having a frequency of half of a frequency of the second clock signal; and
      a second counter configured to count the number of pulse signals in the second oscillation signal to output the second digital signal.

16. The ADC of claim 15, wherein the second VCO comprising:
   a second time delayer configured to delay a time of the second sampling signal by operating a plurality of inverters connected in a forward direction or a plurality of inverters connected in a reverse direction according to a clock signal applied by receiving the second sampling signal; and
   a second oscillation frequency controller connected to the second time delayer and configured to control a frequency of the second oscillation signal using a frequency of the second sampling signal to output a voltage swing.

17. The ADC of claim 16, wherein the second time delayer comprising:
   a first delayer configured to delay the time of the second sampling signal by supplying a power supply voltage to the plurality of inverters, which are built-in and connected in the forward direction, and simultaneously operating the plurality of inverters when the third clock signal is applied, and
   a second delayer configured to delay the time of the second sampling signal by supplying the power supply voltage to the plurality of inverters, which are built-in and connected in the reverse direction, and simultaneously operating the plurality of inverters when the fourth clock signal having a phase opposite to that of the third clock signal is applied.

18. The ADC of claim 17, wherein at a time point at which the applied clock signal is changed from the third clock signal to the fourth clock signal:
   a voltage of the second oscillation signal at a corresponding node is held; and
   a phase of the second oscillation signal is changed and proceeds in a direction opposite to a direction in which the phase initially proceeds.

\* \* \* \* \*